(12) United States Patent
Kumar et al.

(10) Patent No.: US 10,153,785 B1
(45) Date of Patent: Dec. 11, 2018

(54) GENERALIZED LOW-DENSITY PARITY-CHECK (GLDPC) CODE WITH VARIABLE LENGTH CONSTITUENTS

(71) Applicant: SK Hynix Inc., Gyeonggi-do (KR)

(72) Inventors: Naveen Kumar, San Jose, CA (US); Aman Bhatia, San Jose, CA (US); Fan Zhang, Fremont, CA (US); Chenrong Xiong, San Jose, CA (US); Yu Cai, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/607,234

(22) Filed: May 26, 2017

(51) Int. Cl.
  *H03M 13/35* (2006.01)
  *G06F 11/10* (2006.01)
  *H03M 13/11* (2006.01)
  *H03M 13/29* (2006.01)

(52) U.S. Cl.
  CPC ....... *H03M 13/356* (2013.01); *G06F 11/1076* (2013.01); *H03M 13/1108* (2013.01); *H03M 13/1111* (2013.01); *H03M 13/1151* (2013.01); *H03M 13/2906* (2013.01)

(58) Field of Classification Search
  CPC ........... H03M 13/356; H03M 13/1108; H03M 13/1111; H03M 13/1151; H03M 13/2906; G06F 11/1076
  See application file for complete search history.

(56) References Cited

U.S. PATENT DOCUMENTS

| 8,386,879 | B2 | 2/2013 | Djordjevic et al. | |
|---|---|---|---|---|
| 2009/0282314 | A1* | 11/2009 | Djordjevic | H03M 13/296 714/755 |
| 2012/0054576 | A1* | 3/2012 | Gross | H03M 13/1117 714/752 |
| 2017/0187395 | A1* | 6/2017 | Watanabe | H03M 13/2909 |
| 2017/0262646 | A1* | 9/2017 | Armstrong | G06F 21/6218 |

OTHER PUBLICATIONS

L. R. Bahl et al, "Optimal decoding of linear codes for minimizing symbol error rate" IEEE Trans. Inf. Theory, vol. 20, No. 2, Mar. 1974, pp. 284-287, IEEE, 4 pages.

(Continued)

*Primary Examiner* — Kyle Vallecillo
(74) *Attorney, Agent, or Firm* — Kilpatrick Townsend & Stockton LLP

(57) ABSTRACT

Techniques for improving the bit error rate (BER) performance of an error correction system are described. In an example, the error correction system implements generalized low-density parity-check (GLDPC) encoding and decoding. To generate a GLDPC codeword, the error correction system accesses data blocks. Each data block includes one or more bits. The error correction system also generates a first constituent codeword of the GLDPC codeword. The first constituent codeword encodes at least a data block from the data blocks and has a first length and a first error correction capability. The error correction system also generates a second constituent codeword of the GLDPC codeword. The second constituent codeword encodes at least the data block and has a second length and a second error correction capability. The second length is different from the first length. The second error correction capability is different from the first error correction capability.

20 Claims, 9 Drawing Sheets

(56) References Cited

OTHER PUBLICATIONS

R. Michael Tanner, "A Recursive Approach to Low Complexity Codes" IEEE Transactions on Information Theory, Sep. 1981, pp. 533-547, vol. IT-27, No. 5, IEEE, 15 pages.

J. Boutros, "Generalized Low Density (Tanners) Codes" 1999, pp. 441-445, IEEE, 5 pages.

Tong Zhang et al, "High-Performance, Low-Complexity Decoding of Generalized Low-Density Parity-Check Codes" Proc. IEEE Global Telecommunications Conf. 2001 (IEEE GLOBECOM), vol. 1, 2001, pp. 181-185, IEEE, 5 pages.

Alexei Ashikhmin et al, "Simple MAP Decoding of First-Order Reed-Muller and Hamming Codes" IEEE Trans. Inf. Theory, vol. 50, No. 8, Aug. 2004, pp. 1812-1818, IEEE, 7 pages.

Ivan B. Djordjevic, "Generalized Low-Density Parity-Check Codes for Optical Communication Systems" Journal of Lightwave Technology, May 2005, pp. 1939-1946, vol. 23 No. 5, IEEE, 8 pages.

Guosen Yue, "Generalized Low-Density Parity-Check Codes Based on Hadamard Constraints" IEEE Trans. Inf. Theory, Mar. 2007, pp. 1058-1079, vol. 53, No. 3, IEEE, 22 pages.

Ivan B. Djordjevic, "GLDPC Codes with Reed-Muller Components Codes Suitable for Optical Communications" IEEE Communications Letters, Sep. 2008, pp. 684-686, vol. 12, No. 9, IEEE, 3 pages.

\* cited by examiner

GENERALIZED LOW-DENSITY PARITY-CHECK (GLDPC) CODE WITH VARIABLE LENGTH CONSTITUENTS

CROSS-REFERENCES TO RELATED APPLICATIONS

NOT APPLICABLE

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND

Data integrity is an important feature for any data storage device and data transmission. Use of strong error-correction codes (ECCs) is recommended for various types of data storage devices include NAND flash memory devices. ECCs are also frequently used during the process of data transmission.

Error correcting code (ECC) refers to codes that add redundant data, or parity data, to a message, such that the message can be recovered by a receiver even when a number of errors were introduced, either during the process of transmission, or storage. In general, the ECC can correct the errors up to the capability of the code being used.

Generalized low-density parity-check (GLDPC) codes are an example of ECC. GLDPC codes generally provide an excellent bit error rate (BER) performance. However, it is difficult to design an encoder for these type of codes.

Maximum aposteriori probability (MAP) decoders can also be used to decode these codes. There is a remarkable performance gain with the MAP decoding on GLDPC compared to low-density parity-check (LDPC) and Bose-Chaudhuri-Hocquenghem (BCH) codes. A MAP decoder has the capability to generate soft information while decoding and, thus, can be used for both hard and soft decoding.

BRIEF SUMMARY

Techniques for improving the bit error rate (BER) performance of an error correction system are described. In an example, the error correction system implements generalized low-density parity-check (GLDPC) encoding and decoding. The construction of a GLDPC code follows a set of rules. The set of rule specifies that each data block should be protected in at least two constituent codewords. The set of rules also specifies that the length and the error correction capability should vary between the constituent codewords. For example, the set of rules specify that at least two of the constituent codewords should have different lengths and that the error correction capability of the longer constituent codeword should be greater than the error correction capability of the shorted constituent codeword. Based on the set of rules, the error correction system generates the GLDPC codeword that has constituent codewords with variable lengths and error correction capabilities.

In an illustration, the error correction system accesses data blocks. Each data block includes one or more bits. The error correction system also generates a first constituent codeword of the GLDPC codeword. The first constituent codeword encodes at least a data block from the data blocks and has a first length and a first error correction capability. The error correction system also generates a second constituent codeword of the GLDPC codeword. The second constituent codeword encodes at least the data block and has a second length and a second error correction capability. The second length is different from the first length. The second error correction capability is different from the first error correction capability.

In an example, the decoding of the GLDPC codeword resolves stuck error pattern. For instance, the error correction system identifies that the decoding of constituent codewords failed. For the failed constituent codewords, the system identifies the data block(s) that is (are) shared between the constituent codewords. These data blocks are erased in the subsequent decoding of the failed constituent codewords. The remaining data blocks that are not common are not erased in the subsequent decoding.

Referring back to the above illustration, the error correction system determines that the decoding of the first constituent codeword failed based on a first number of errors in the first constituent codeword and on the first error correction capability of the first constituent codeword. The error correction system also determines that decoding of the second constituent codeword failed based on a second number of errors in the second constituent codeword and on the second error correction capability of the second constituent codeword. Based on a failure of the decoding of the first constituent codeword and the second constituent codeword, the error correction system determines that the first constituent codeword and the second constituent codeword have the data block in common. The error correction system erases the data block based on the data block being common to the first constituent codeword and the second constituent codeword and decodes again the first constituent codeword and the second constituent codeword based on an erasure of the data block. Further, the error correction system determines that a second data block of the second constituent codeword is common with a third constituent codeword and that the decoding of the third constituent codeword was a success. The error correction system avoids an erasure of the second data block in the second constituent codeword based on the success of the decoding of the third constituent codeword.

These illustrative examples are mentioned not to limit or define the disclosure, but to provide examples to aid understanding thereof. Additional embodiments and examples are discussed in the Detailed Description, and further description is provided there.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
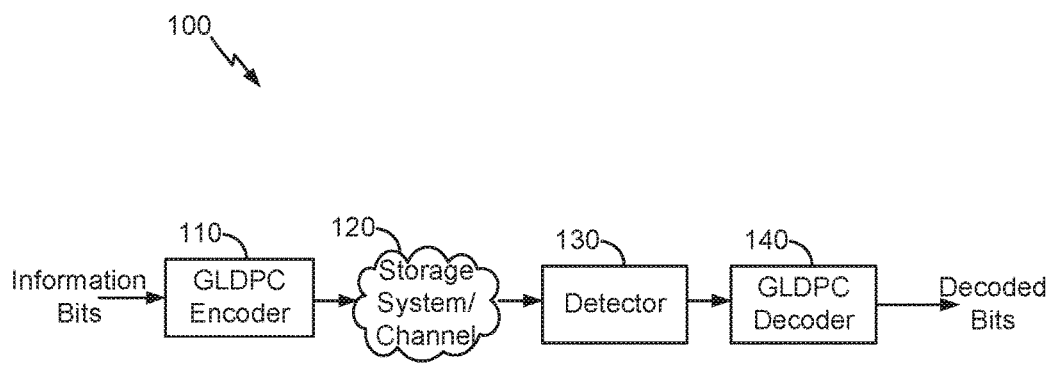
FIG. 1 illustrates an example high level block diagram of an error correcting system, in accordance with certain embodiments of the present disclosure.

Embodiments of the present disclosure are directed to improving the bit error rate (BER) performance of an error correction system. In an example, the error correction system uses generalized low-density parity-check (GLDPC) encoding and decoding. In the encoding phase, a GLDPC codeword is constructed by forming constituent codewords according to a set of rules. The set of rules specifies that each bit should be protected at least twice (e.g., in at least two constituent codewords). The set of rules also specify that the constituent codewords should vary in length and in error correction capability. According to the set of rules, shorter length constituent codewords are protected with lower error correction capability, whereas longer length constituent codewords are protected with higher error correction capability. Hence, the GLDPC codeword includes at least two constituent codewords that have at least one bit in common. This bit is protected twice. The length and error correction capability are different between the two constituent codewords. For instance, the second constituent codeword is longer and, thus, has a higher error correction capability relative to the first constituent codeword. The uneven distribution of length and error correction capability provides performance gains. More specifically, because the lengths and error correction capabilities of the constituent codewords vary and because each bit is protected at least twice, the constructed GLDPC codeword is more resilient to noise. Therefore, when decoded, this GLDPC codeword provides a better BER performance relative to existing GLDPC codewords, such as a GPC codeword that has fixed-length and fixed-error correction capability for its constituent codewords.

The decoding can be further improved by taking advantage of the protection of the bits across multiple constituent codewords. In an example, a stuck error pattern appears in a subset of constituent codewords when, for each of these failed constituent codewords, the number of errors is greater than the error correction capability of the failed constituent codeword. To resolve the stuck error pattern, the bits on the failed constituent codes are erased. For instance, a decoder identifies two failed constituent codeword that have a bit in common. That bit is erased in both constituent codewords. Other bits of the two failed codewords are not erase if they are not common to the two constituent codewords. The decoding is then repeated. If a MAP decoder is Using this erasure scheme with the MAP decoder shows no error floor in simulation.

In the interest of clarity of explanation, the embodiments of the present disclosure are described in connection with using BCH codes to construct constituent codewords for a GLDPC codeword. However, the embodiments are not limited as such and apply to using any other linear codes such as codes, such as, Hamming codes, Reed-Solomon (RS) codes, and Reed-Muller (RM) codes, or any suitable non-linear codes. Further, the embodiments of the present disclosure are described in connection with protecting a bit twice (e.g., by encoding the bit in two constituent codewords). However, the embodiments are not limited as such and apply to additional dimensions of protection, such as a bit can be protected three times or more (e.g., by encoding the bit in three or more constituent codewords). Generally, the GLDPC codeword is constructed by protecting each information bit in at least two constituent codewords and by varying the length and correction capability of the constituent codewords.

FIG. 1 illustrates an example high level block diagram of an error correcting system 100, in accordance with certain embodiments of the present disclosure. In the example, GLDPC codes are described in connection with data storage. However, the embodiments of the present disclosure are not limited as such. Instead, the embodiments similarly apply to other usage of GLDPC codes including, for example, data transmission.

GLDPC codes are generalized LDPC codes. To better understand GLDPC codes, LDPC codes are described first. LDPC codes are linear block codes defined by a sparse parity-check matrix H, which consists of zeros and ones. The term "sparse matrix" is used herein to refer to a matrix in which a number of non-zero values in each column and each row is much less than its dimension. The term "column weight" is used herein to refer to the number of non-zero values in a specific column of the parity-check matrix H. The term "row weight" is used herein to refer to number of non-zero values in a specific row of the parity-check matrix H. In general, if column weights of all of the columns in a parity-check matrix corresponding to an LDPC code are similar, the code is referred to as a "regular" LDPC code. On the other hand, an LDPC code is called "irregular" if at least one of the column weights is different from other column weights. Usually, irregular LDPC codes provide better error correction capability than regular LDPC codes.

The LDPC codes are also described according to the way they are constructed. Random computer search or algebraic constructions are possible. The random computer search construction describes an LDPC code having a parity-check matrix designed by a random computer-based procedure. Algebraic construction implies that the parity-check matrix has been constructed based on combinatorial methods. Quasi-cyclic LDPC (QC-LDPC) codes fall under the latter construction method. One advantage of QC-LDPC codes is that they have a relatively easier implementation in terms of the encoding procedure. The main feature of QC-LDPC codes is that the parity-check matrix consists of circulant submatrices, which could be either based on an identity matrix or a smaller random matrix. Permutation vectors could also be used in order to create the circulant submatrices. Regardless of the type of an LDPC code, the parity-check matrix H represent a set of parity-check equations that are used in the decoding of the LDPC codes. The LDPC codeword is successfully decoded when the parity-check equations are satisfied.

Turning to GLDPC, to construct a GLDPC code, one can replace each single parity-check equation of a LDPC code by the parity-check matrix of a simple linear block code (e.g. such as a BCH code), known as the constituent (local) code. This type of code construction is referred to as LZ-GLDPC code construction in the industry. Other code constructions are also possible. For example, in a code construction referred to as B-GLDPC code construction, the parity-check matrix, H, is a sparse matrix partitioned into W sub-matrices $H_1, \ldots, H_W$. $H_1$ is a block-diagonal matrix generated from an identity matrix by replacing the ones by a parity-check matrix of a local code of codeword-length n and dimension k. Each sub-matrix $H_j$ is derived from $H_1$ by random column permutations. The code rate of a GLDPC code is lower bounded by $$R = \frac{K}{N} \geq 1 - W\left(1 - \frac{k}{n}\right),$$

where K and N denote the dimension and the codeword-length of the GLDPC code, W is the column weight of the LDPC code, and k/n is the code rate of a local code (k and n denote the dimension and the codeword-length of a constituent codeword).

Hence, a GLDPC codeword typically includes multiple constituent codewords. The constituent codewords, which are typically much shorter than the GLDPC codeword, are constructed using any suitable linear codes, such as, for example, Hamming codes, BCH codes, Reed-Solomon (RS) codes and Reed-Muller (RM) codes, or any suitable non-linear codes. The GLDPC codeword is typically designed so that each of the constituent codewords shares one or more bits with at least one other constituent codeword.

One possible way to decode a GLDPC codeword is to decode the individual constituent codewords, using respective constituent decoders. The decoding would perform one or more decoding iterations in an attempt to reach a state in which each of the constituent decoders outputs a valid constituent codeword. Sharing of bits among the constituent codewords assists in correcting erroneous bits beyond the error correction capabilities of the individual constituent codewords.

The constituent decoders in the decoding scheme can include hard or soft decoders whose input and output include hard decisions or soft information, respectively. The soft information includes, in addition to the hard decisions, respective reliability measures that are assigned to these hard decisions. The reliability measures may comprise log-likelihood ratios (LLRs), where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The input to a GLDPC hard decoder conventionally includes channel hard decisions for the bits of the codeword. The input to a GLDPC soft decoder conventionally includes, in addition to the hard decision bits, reliability measures assigned to these bits. Each of the underlying constituent decoders receives part of the input corresponding to the respective constituent codeword.

In GLDPC hard decoding, the hard constituent decoders accept the channel hard decisions and derive output hard decisions that are used by some of constituent decoders in the same or subsequent iterations. In some variant hard decoders, the output of the constituent decoders is combined with the channel hard decisions to be used in subsequent iterations. In GLDPC soft decoding, the soft constituent decoders accept the channel soft information and derive output soft information that is used by some of the constituent decoders in the same or subsequent iterations. In a given iteration, a constituent soft decoder updates its output soft information based on the channel soft inputs, previously generated soft outputs, and its decoding results.

Typically, GLDPC soft decoders have better error correcting capabilities than GLDPC hard decoders, but incur higher complexity, latency and power consumption. Soft decoders are additionally less vulnerable to stuck error patterns than hard decoders. A struck error pattern is associated with a decoding state in which one or more of the constituent codewords fail to decode to a valid constituent codeword and applying additional decoding iterations does not resolve the failure state. A stuck error pattern in a hard decoder occurs, for example, when multiple constituent codewords share a number of erroneous bits that exceeds the error correction capabilities of the underlying constituent codewords.

As illustrated in FIG. 1, a GLDPC encoder 110 receives information bits that include data which is desired to be stored in a storage system 120. GLDPC encoded data (e.g., GLDPC codewords) is output by the GLDPC encoder 110 and is written to the storage 120.

In various embodiments, the storage 120 may include a variety of storage types or media such as (e.g., magnetic) disk drive storage, Flash storage, etc. In some embodiments, the techniques are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), a detector 130 receives data from the storage system 120. The received data may include some noise or errors. The detector 130 performs detection on the received data and outputs decision and/or reliability information. For example, a soft output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision.

The decision and/or reliability information is passed to a GLDPC decoder 140 which performs GLDPC decoding using the decision and reliability information. A soft input decoder utilizes both the decision and the reliability information to decode the codeword. A hard decoder utilizes only the decision values in the decoder to decode the codeword. In many situations, the decoding is iterative and the GLDPC decoder 140 includes a plurality of constituent decoders, each of which may be a hard decoder or a soft decoder. For example, a BCH decoder can be used for hard decoding each constituent codeword when such constituent codewords are BCH codes. In addition or in the alternative, a maximum a posteriori probability (MAP) decoder can be used for soft decoding each of the constituent codewords. The decoded bits generated by the GLDPC decoder 140 are passed to the appropriate entity (e.g., the user or application which requested it). With proper encoding and decoding, the information bits match the decoded bits.

In various embodiments, the system shown may be implemented using a variety of techniques including an application-specific integrated circuit (ASIC), a field-programmable gate array (FPGA), and/or a general purpose processor (e.g., an Advanced RISC Machine (ARM) core).

Figure 2:
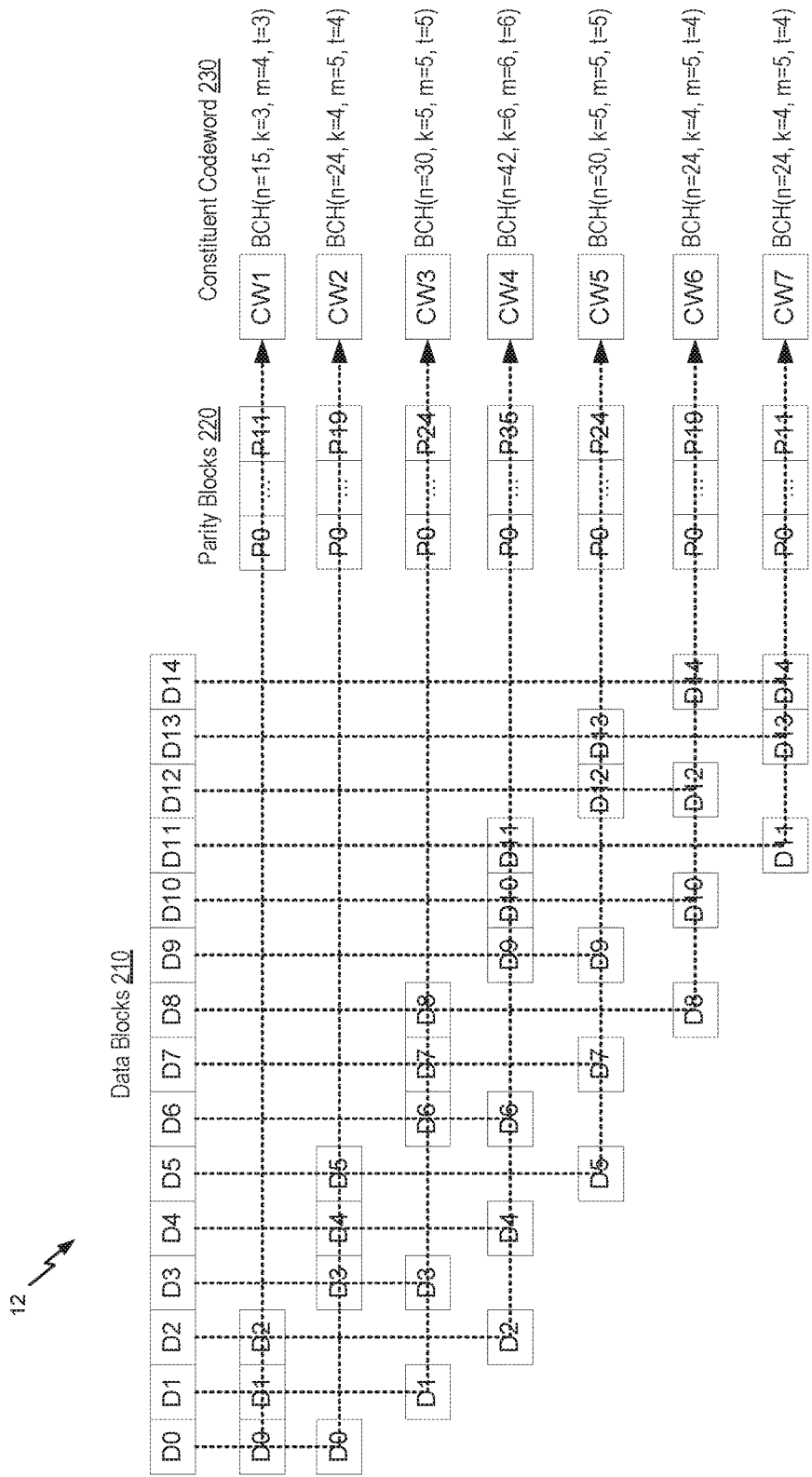
FIG. 2 illustrates an example block diagram for constructing a GLDPC codeword having constituent codewords with variable lengths and error correction capabilities, in accordance with certain embodiments of the present disclosure.

FIG. 2 illustrates an example block diagram 200 for constructing a GLDPC codeword having constituent codewords with variable lengths and error correction capabilities, in accordance with certain embodiments of the present disclosure. As illustrated, the GLDPC codeword includes a number of constituent codewords 230 (shown as CW1, . . . , CW7). As further described herein next, each information bit is protected in two constituent codewords 230 and the constituent codewords 230 have variable length and error correction capability.

In some embodiments, information bits are grouped in data blocks 210, shown as D0, . . . , D14 for a total of fifteen data blocks. A different number of data blocks can be used. Each block Dk contains "j" information bits, where "j" is a positive integer (e.g., one, two, three, eight, sixteen, etc.). In the construction of the GLDPC codeword, each data block is protected twice. For example, the constituent codewords CW1 and CW2 encode the data block D0.

Parity blocks 220 are also used in the construction of the GLDPC codeword. Each parity block Pk contains "j" parity bits, where "j" is a positive integer (e.g., one, two, three, eight, sixteen, etc.). Data blocks for a constituent codeword are protected with a number of parity blocks, where the data blocks and parity blocks are encoded using a BCH code (or any other linear or non-linear code). If BCH is used, the constituent codewords 230 can be referred to as BCH constituent codewords.

A BCH constituent codeword is formed over a Galois field of order 2 and a size "m" (e.g. $GF(2^m)$) and has a length "n," where "$n=2^m-1$." The BCH constituent codeword contains "k" data blocks and "n−k" parity blocks. The error correction capability "t" of the BCH constituent codeword is "$t=(n-k)/m$."

In addition to protecting each data block twice, in the construction of the GLDPC codeword, the length "n" varies between the BCH constituent codewords 230. The error correction capability "t" also varies between the BCH constituent codewords 230. Varying the length "n" and error correction capability "t" forces the use of a specific number of data blocks and a specific number of parity blocks.

For example, and as illustrated in FIG. 2, for the BCH constituent codeword CW1, a Galois field size of "m=4" is used ($2^4-1=15$) and, accordingly, CW1 has a length "n=15." The error correction capability of CW1 is "t=3." Accordingly, the number of data blocks "k" is three because "k=n−t×m" (15−3×4=3). And the number of parity block "n−k" is twelve (15−3=12).

Hence and as illustrated in FIG. 2, the data block D0 is protected in BCH constituent codewords CW1 and CW2; the data block D1 is protected in BCH constituent codewords CW1 and CW3; the data block D 2 is protected in BCH constituent codewords CW1 and CW4; the data block D4 is protected in BCH constituent codewords CW2 and CW3; the data block D0 is protected in BCH constituent codewords CW2 and CW4; the data block D5 is protected in BCH constituent codewords CW2 and CW5; the data block D6 is protected in BCH constituent codewords CW3 and CW4; the data block D7 is protected in BCH constituent codewords CW3 and CW5; the data block D8 is protected in BCH constituent codewords CW3 and CW6; the data block D9 is protected in BCH constituent codewords CW4 and CW5; the data block D10 is protected in BCH constituent codewords CW4 and CW6; the data block D11 is protected in BCH constituent codewords CW4 and CW7; the data block D12 is protected in BCH constituent codewords CW5 and CW6; the data block D13 is protected in BCH constituent codewords CW5 and CW7; and the data block D14 is protected in BCH constituent codewords CW6 and CW7.

Furthermore, the BCH constituent codeword CW1 has a length of sixteen and an error correction capability of three and encodes three data blocks (D0, D1, D2) and twelve parity blocks (P0, . . . , P11); the BCH constituent codeword CW2 has a length of twenty-four and an error correction capability of four and encodes four data blocks (D0, D3, D4, D5) and twenty parity blocks (P0, . . . , P19); the BCH constituent codeword CW3 has a length of thirty and an error correction capability of five and encodes five data blocks (D1, D3, D6, D7, D8) and twenty-five parity blocks (P0, . . . , P24); the BCH constituent codeword CW4 has a length of forty-two and an error correction capability of six and encodes six data blocks (D2, D4, D6, D9, D10, D11) and thirty-six parity blocks (P0, . . . , P35); the BCH constituent codeword CW5 has a length of thirty and an error correction capability of five and encodes five data blocks (D5, D7, D9, D12, D13) and twenty-five parity blocks (P0, . . . , P24); the BCH constituent codeword CW6 has a length of twenty-four and an error correction capability of four and encodes four data blocks (D8, D10, D12, D14) and twenty parity blocks (P0, . . . , P19); and the BCH constituent codeword CW7 has a length of sixteen and an error correction capability of three and encodes three data blocks (D11, D13, D14) and twelve parity blocks (P0, . . . , P11). Note that the same parity notation is used in the interest of clarity of explanation (e.g. P0 for both CW1 and CW2), but the actual parity bits need not be the same (e.g., P0 is a "1" parity bit in CW1 and a "0" parity bit in CW2).

Although FIG. 2 illustrates a GLDPC codeword with seven BCH constituent codewords, each having a particular length and error correction capabilities, other possible constructions for the GLDPC codeword are possible. For example, depending on the desired code rate, a different number of constituent codewords and/or length and error correction capability per constituent codeword can be used.

Figure 3:
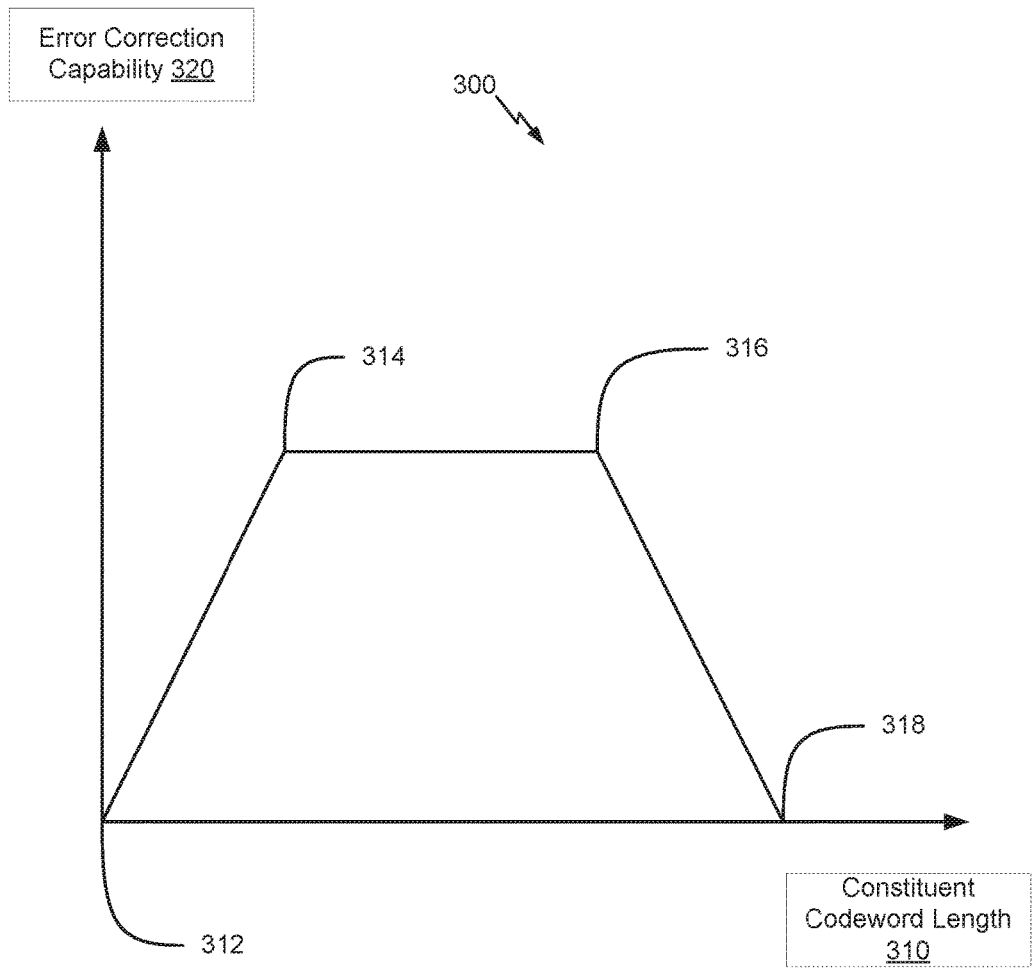
FIG. 3 illustrates an example representation of a rule for constructing a GLDPC codeword having constituent codewords with variable lengths and error correction capabilities, in accordance with certain embodiments of the present disclosure.

FIG. 3 illustrates an example representation 300 of a rule for constructing a GLDPC codeword having constituent codewords with variable lengths and error correction capabilities, in accordance with certain embodiments of the present disclosure. Generally, the rule specifies that a data block (that includes at least one information bit) should be protected in at least two constituent codewords. The rule also specifies that the length and the error correction capability should vary between the constituent codewords. In the interest of clarity of explanation, the rule is described in connection with the BCH constituent codewords 230 of FIG. 2.

In some embodiments, the rule specifies that the length should vary and that a change to the error correction capability of a constituent codeword should be based on a length of that constituent codeword. For example, the longer the constituent codeword is, the greater its error correction capability should be. Conversely, the shorter the constituent codeword is, the smaller its error correction capability should be. Referring back the BCH constituent codewords 230 of FIG. 2, the BCH constituent codewords CW1 and CW2 have each a length of fifteen and twenty-four, respectively. Thus, the length varies between the BCH constituent codewords CW1 and CW2. Further, because the BCH constituent codeword CW2 is longer than the BCH constituent codeword CW1 (e.g., the length of CW2 is twenty-four and is greater than the length of CW1 which is fifteen), the error correction capability of the BCH constituent codeword CW2 is greater than the error correction capability of the BCH constituent codeword CW1 (as shown in FIG. 2, the error correction capability of CW2 is four and is greater than the error correction capability of CW1 which is three).

In some embodiments, the rule additionally or alternatively specifies the length and the error correction capability as the GLDPC codeword is constructed. In an example, the data blocks are organized in a sequence, where each data block corresponds to an order in the sequence. The rule varies the length and the error correction capability based on the access to the sequence of the data blocks (or, equivalently, on the order of the generated constituent codeword in the sequence of constituent codewords).

As illustrated in FIG. 2, the information bits are organized in a sequence of fifteen data blocks. D0 is the first data block in the sequence of the data blocks 210 D0-D14, D1 is the second data block in the sequence of the data blocks 210 D0-D14, and so on and so forth. The sequence of data blocks is accessed to generate a sequence of BCH constituent codewords. As also illustrated in FIG. 2, the data blocks D0, D1, D2 are accessed to generate the BCH constituent codeword CW1, the data blocks D0, D3, D4, D5 are accessed to generate the BCH constituent codeword CW2 and so on and so forth. CW1 is the first constituent codeword in the sequence of the BCH constituent codewords 230 CW1-CW7, CW2 is the second constituent codeword in the sequence of the BCH constituent codewords 230 CW1-CW7, and so on and so forth.

Depending on the order of a constituent codeword in the sequence, the rule sets a length of the constituent codeword. For example, the rule specifies that the length should initially increase with an increase of the order of the generated constituent codeword, remain constant thereafter for a number of generated constituent codewords, and should decrease for the last remaining number of generated constituent codewords. The rule also specifies that an error correction capability of the constituent codeword increases with an increase to the length of the constituent codeword, remains constant with the length of the constituent codeword remaining constant, and decreases with a decrease to the length of the constituent codeword, where the length depends on the order of the constituent codeword in the sequence. The representation 300 illustrates this type of rule. Of course, the rule can specify other variations (e.g., an initial decrease and a final increase, a bell curve-like change, a linear increase, a step increase, etc.)

As illustrated in FIG. 3, the length 310 and the error correction capability 320 of a constituent codeword are shown on the horizontal axis and vertical axis, respectively, of the representation 300. An initial constituent codeword of the sequence (e.g., the constituent codeword being ordered first in the sequence of constituent codewords) corresponds to an origin 312 of the representation 300. Referring to the BCH constituent codewords 230 of FIG. 2, the initial constituent codeword is the BCH constituent codeword CW1. The initial constituent codeword has the shortest length and the smallest error correction capability (e.g., the BCH constituent codeword CW1 of FIG. 2 has the shortest length of fifteen and the smallest error capability of three).

The rule specifies that the length of a constituent codeword increases based on the constituent codeword being between the initial constituent codeword of the sequence and a first intermediary constituent codeword of the sequence. The error correction capability also increases with an increase to the length. The first intermediary constituent codeword corresponds to a point 314 in the representation 300. Referring to the BCH constituent codewords 230 of FIG. 2, the first constituent codeword is the BCH constituent codeword CW4. The order of the BCH constituent codewords CW2 and CW3 fall between the BCH constituent codewords CW1 and CW4 in the sequence. Hence, the length and error correction capability of BCH constituent codewords CW2 and CW3 increase relative to BCH constituent codeword CW1. Referring again to FIG. 2, the BCH constituent codeword CW2 is longer than the BCH constituent codeword CW1 but shorter than the BCH constituent codeword CW3. Similarly, the error correction capability of the BCH constituent codeword CW2 is greater than that of the BCH constituent codeword CW1 but smaller than that of the BCH constituent codeword CW3.

The rule also specifies that the length of the constituent codeword remains constant at the greatest length value between the first intermediary constituent codeword and a second intermediary codeword of the sequence. The error correction capability also remains constant at the greatest error correction capability value. The second intermediary constituent codeword corresponds to a point 316 in the representation 300. Referring to the BCH constituent codewords 230 of FIG. 2, the second intermediary constituent codeword is the BCH constituent codeword CW4 (nonetheless, a subsequently ordered constituent codeword can be the second intermediary codeword). The order of the BCH constituent codeword CW4 falls between the first and second intermediary constituent codewords in the sequence (which are the same in the example of FIG. 2). Hence, the length and error correction capability of BCH constituent codewords CW4 remain constant and are the greatest relative to the remaining BCH constituent codewords. In other words, the BCH constituent codeword CW4 is longer and has better error correction capability relative to the BCH constituent codewords CW1-CW3 and CW5-CW7.

The rule specifies that the length of the constituent codeword decreases based on the constituent codeword being between the second intermediary constituent codeword of the sequence and a last constituent codeword of the sequence. The error correction capability also decreases with a decrease of the length. The last constituent codeword corresponds to a point 318 in the representation 300. Referring to the BCH constituent codewords 230 of FIG. 2, the last constituent codeword is the BCH constituent codeword CW7. The order of the BCH constituent codewords CW5 and CW6 fall between the BCH constituent codewords CW4 and CW7 in the sequence. Hence, the length and error correction capability of BCH constituent codewords CW5 and CW6 decrease relative to BCH constituent codeword CW4. Referring again to FIG. 2, the BCH constituent codeword CW5 is shorter than the BCH constituent codeword CW4 but longer than the BCH constituent codeword CW6. Similarly, the error correction capability of the BCH constituent codeword CW5 is smaller than that of the BCH constituent codeword CW4 but greater than that of the BCH constituent codeword CW6.

Finally, the rule specifies that the initial and last constituent codewords (represented by points 312 and 318) have the same length and the same error correction capability. Referring back to the BCH constituent codewords 230 of FIG. 2, the BCH constituent codewords CW1 and CW 7 have the shortest length and the smallest error correction capability relative to the remaining BCH constituent codewords CW2-CW6 (e.g., each of the BCH constituent codewords CW1 and CW7 of FIG. 2 has the shortest length of fifteen and the smallest error capability of three).

Figure 4:
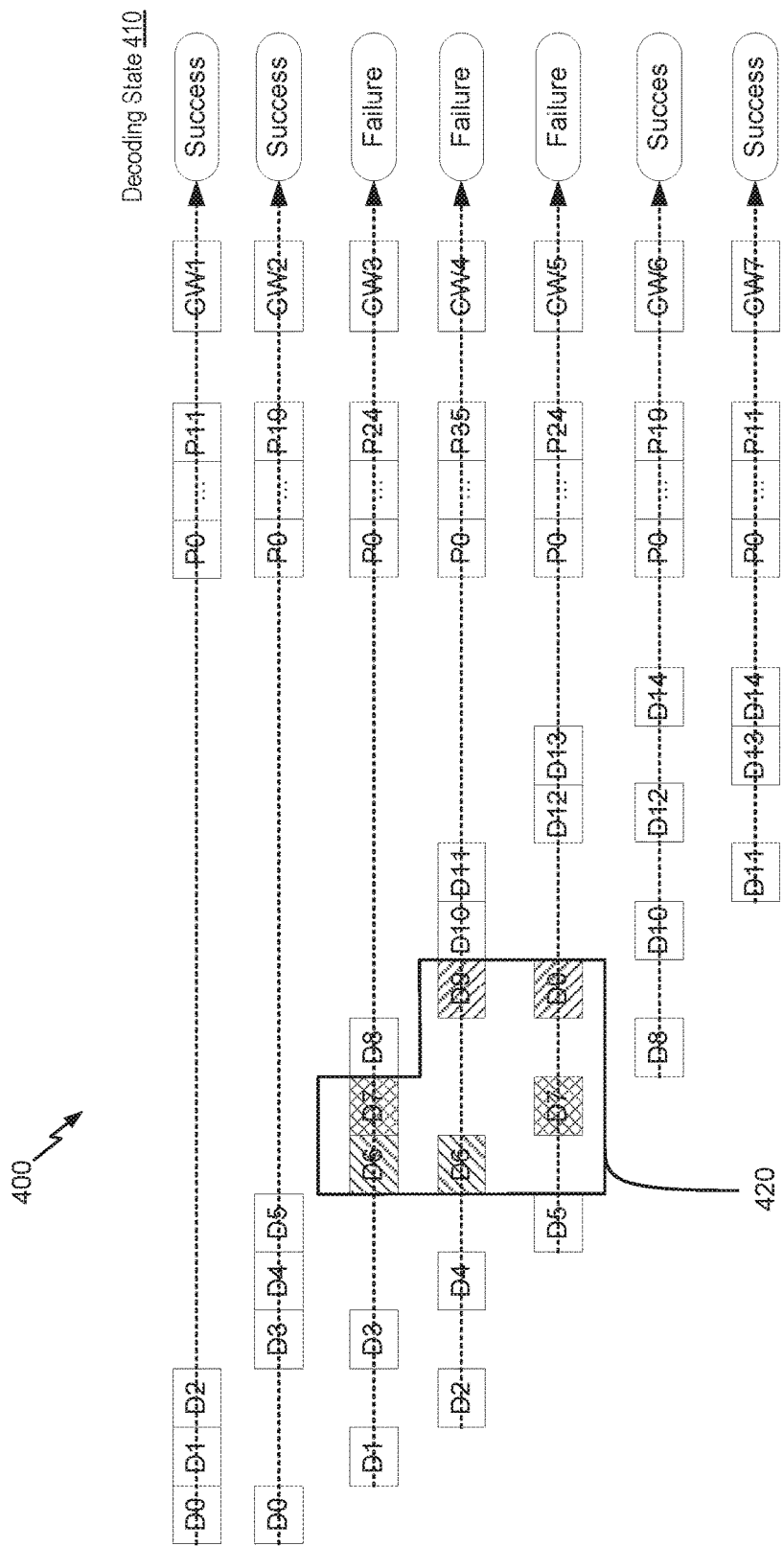
FIG. 4 illustrates an example block diagram for resolving a stuck error pattern of a GLDPC codeword having constituent codewords with variable lengths and error correction capabilities, in accordance with certain embodiments of the present disclosure.

FIG. 4 illustrates an example block diagram 400 for resolving a stuck error pattern of a GLDPC codeword having constituent codewords with variable lengths and error correction capabilities, in accordance with certain embodiments of the present disclosure. Generally, state information about the decoding of the constituent codewords is used to resolve the stuck error pattern. Once resolved, the decoding of at least the constituent codewords can be performed again. In the interest of clarity of explanation, the decoding is described in connection with the BCH constituent codewords 230 of FIG. 2.

As illustrated, a constituent decoder (e.g., a BCH decoding procedure and/or a MAP decoding procedure) is used to decode each of the constituent codewords. An output of a constituent decoder includes an indication of whether the decoding of a corresponding constituent codeword was a success or a failure. This output can be maintained in a decoding state 410. In other words, the decoding state 410 indicates, for each constituent codeword, a state of the decoding (e.g., whether the decoding of the constituent codeword was a success or a failure). If the decoding is iterative, the state is updated at each decoding iteration. For instance, at the end of a decoding iteration, if the decoding of a particular constituent codeword failed, the state is set to "failure" for the particular constituent codeword. Otherwise, the state is set to "success."

A stuck error pattern appears in a subset of constituent codewords when, for each of these failed constituent codewords, the number of errors is greater than the error correction capability of the failed constituent codeword. As illustrated in FIG. 4, the stuck error pattern includes errors in the BCH constituent codewords CW3, CW4, and CW5 (shown with the decoding state 410 set to "failure" for these three constituent codewords). For instance, the BCH constituent codeword CW3 has an error correction capability of five. If a data block (or a parity block) is one bit, and if there are six error bits in the decoding of the BCH constituent codeword CW3, this decoding is stuck.

To resolve the stuck error pattern, the data blocks that are common to the failed constituent codewords are identified and erased and the decoding can be performed again. As illustrated in FIG. 4, the common data blocks across the BCH constituent codewords CW3, CW4, and CW5 are data blocks D6, D7, and D9. More specifically, the data block D6 is common to the BCH constituent codewords CW3 and CW4. The data block D7 is common to the BCH constituent codewords CW3 and CW5. And the data block D9 is common to the BCH constituent codewords CW4 and CW5. Hence, the data blocks D6, D7, and D9 are identified and erased.

Remaining data blocks that belong to the failed constituent codewords but that are not common to at least two of the failed constituent codewords are not erased. For instance, the data blocks D1, D3, and D8 belong to the failed BCH constituent codeword CW3 but are not common with any of the other two failed constituent codewords CW4 and CW5. Hence, the data blocks D1, D3, and D8 are not erased.

The erasure depends on the type of the constituent decoder. In an example, a MAP decoder is used. The erasure sets the LLRs of the data blocks D6, D7, and D9 (e.g., to the bits in these data blocks) to zero. Once the identified data blocks are erased (e.g., the relevant LLRs set to zero), the decoding is performed again. Depending on the type of the constituent decoder, this additional decoding can be limited to the failed constituent codewords (e.g., to the BCH constituent codewords CW3-CW5), can be global to all constituent codewords (e.g., to the BCH constituent codewords CW1-CW7), can occur in the current decoding iteration where the stuck error pattern appeared, or in the next decoding iteration.

Figure 5:
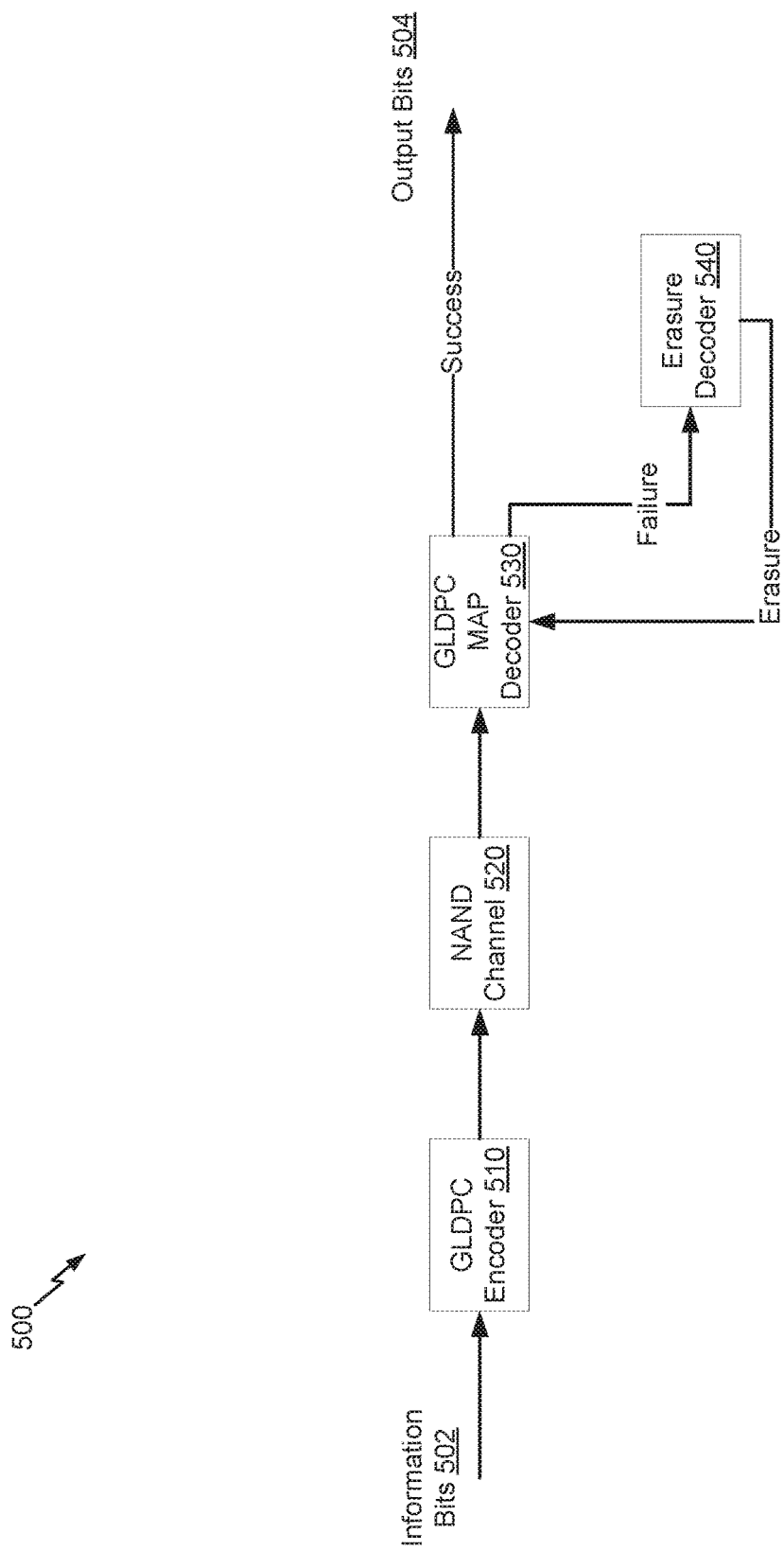
FIG. 5 illustrates an example components for encoding and decoding a GLDPC codeword having constituent codewords with variable lengths and error correction capabilities, in accordance with certain embodiments of the present disclosure.

FIG. 5 illustrates an example components 500 for encoding and decoding a GLDPC codeword having constituent codewords with variable lengths and error correction capabilities, in accordance with certain embodiments of the present disclosure. The components 500 include a GLDPC encoder 510, a NAND channel 520, a GLDPC MAP decoder 530, and an erasure decoder 540. The NAND channel 520 represent a data storage channel that introduces noise to the GLDPC codeword. For instance, assume that $x=[x_0, x_1, \ldots, x_{N-1}]$ is a vector of information bits and is encoded into a GLDPC codeword. Because of the noise of the NAND channel 520, the decoded information bits are a vector $z=[z_0, z_1, \ldots, z_{N-1}]$ that may not match to x. The GLDPC encoding and decoding minimizes the number of differences between the two vectors z and x, where a difference between two corresponding bits is an error bit. The GLDPC encoder 51, GLDPC MAP decoder 530, and erasure decoder 540 represent modules that are used for the encoding and decoding of the information bits. Each of these modules can be implemented in hardware or software hosted on hardware.

As illustrated, information bits are input to the GLDPC encoder 510. In turn, the GLDPC encoder 510 generates a GLDPC codeword by encoding the information bits. The generated GLDPC codeword is stored in a NAND flash memory over the NAND channel 520.

Subsequently, the stored GLDPC codeword is accessed from the NAND flash memory. The GLDPC MAP decoder 530 performs a MAP decoding procedure to decode the accessed GLDPC codeword. Examples of the MAP decoding procedure is described by T. Zhang et al., in "High-performance, low-complexity decoding of generalized low-density parity-check codes," Proc. IEEE Global Telecommunications Conf. 2001 (IEEE GLOBECOM), vol. 1, 2001, ages 181-185, by L. R. Bahl et al., in "Optimal decoding of linear codes for minimizing symbol error rate," IEEE Trans. Inf. Theory, vol. 20, no. 2, March 1974, pages 284-287, and by A. Ashikhmin et al., in "Simple MAP decoding of first order Reed-Muller and Hamming codes," IEEE Trans. Inf. Theory, vol. 50, no. 8, August 2003, pages 1812-1818, whose disclosure is incorporated herein by reference. If the decoding of a constituent codeword is successful, the GLDPC MAP decoder generates output bits 504. If the decoding fails, the erasure decoder 540 is invoked. The erasure decoder 540 identifies the failed constituent codewords and the data blocks that are common to these failed constituent codewords and erases these data blocks. Erasure-related information (e.g., identifiers of the erased data blocks, the LLRs of these data blocks, etc.) are fed back to the GLDPC decoder 530 to re-decode at least the failed constituent codewords. Generally, the loop between the GLDPC MAP decoder 530 and the erasure decoder 540 can be repeated for a number of iterations (e.g., ten or some other predefined number). Using this erasure scheme with the MAP decoder shows no error floor in simulation.

Figure 6:
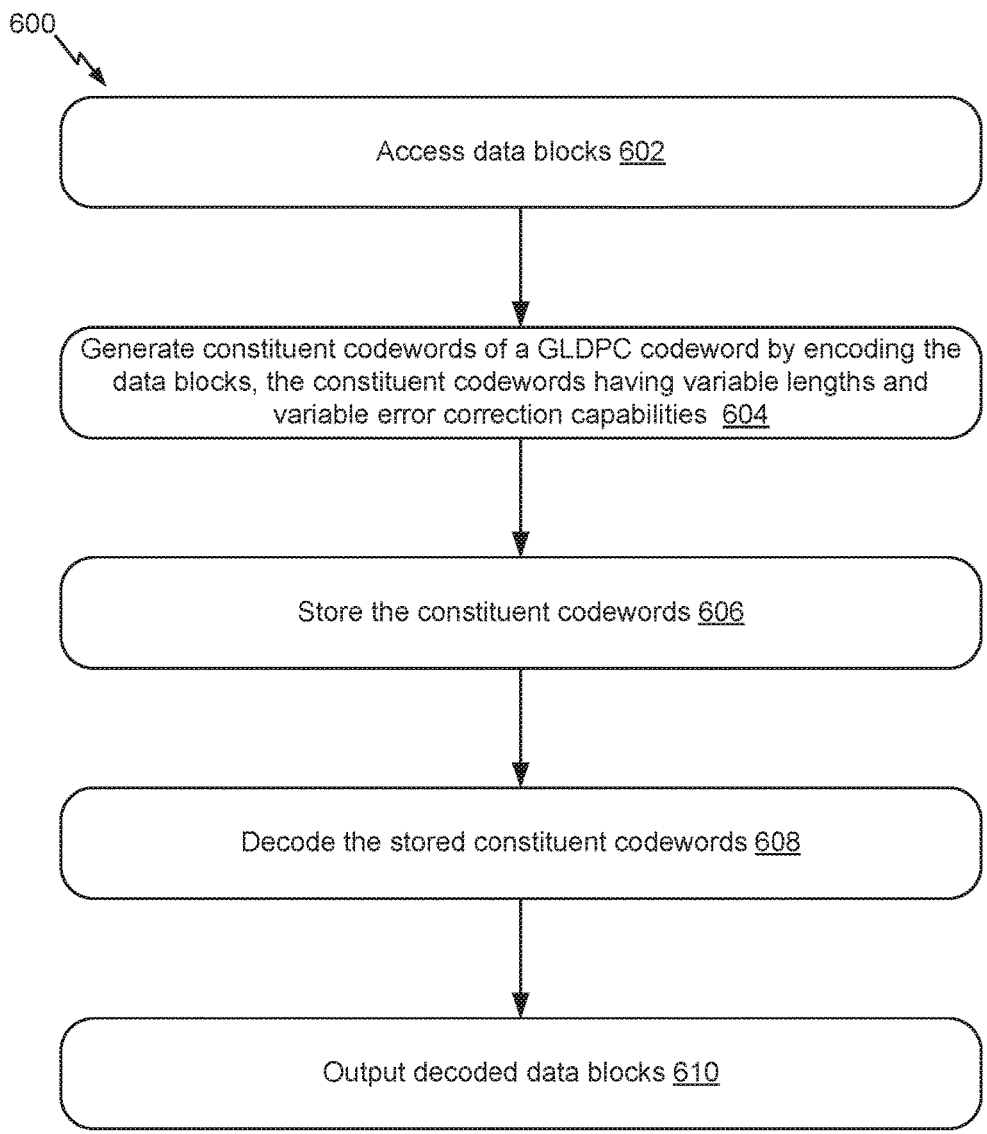
FIG. 6 illustrates example flow for encoding and decoding a GLDPC codeword having constituent codewords with variable lengths and error correction capabilities, in accordance with certain embodiments of the present disclosure.
Figure 7:
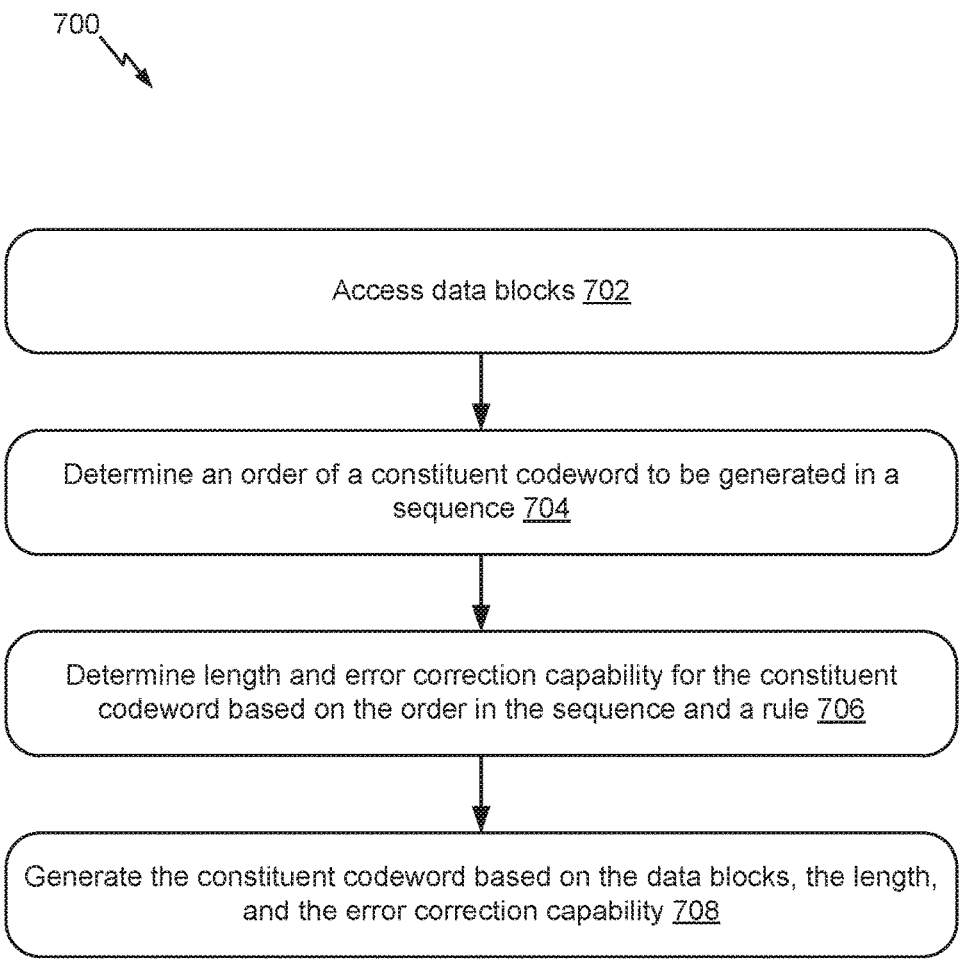
FIG. 7 illustrates an example flow for generating a constituent codeword for a GLDPC codeword having multiple constituent codewords with variable lengths and error correction capabilities, in accordance with certain embodiments of the present disclosure.
Figure 8:
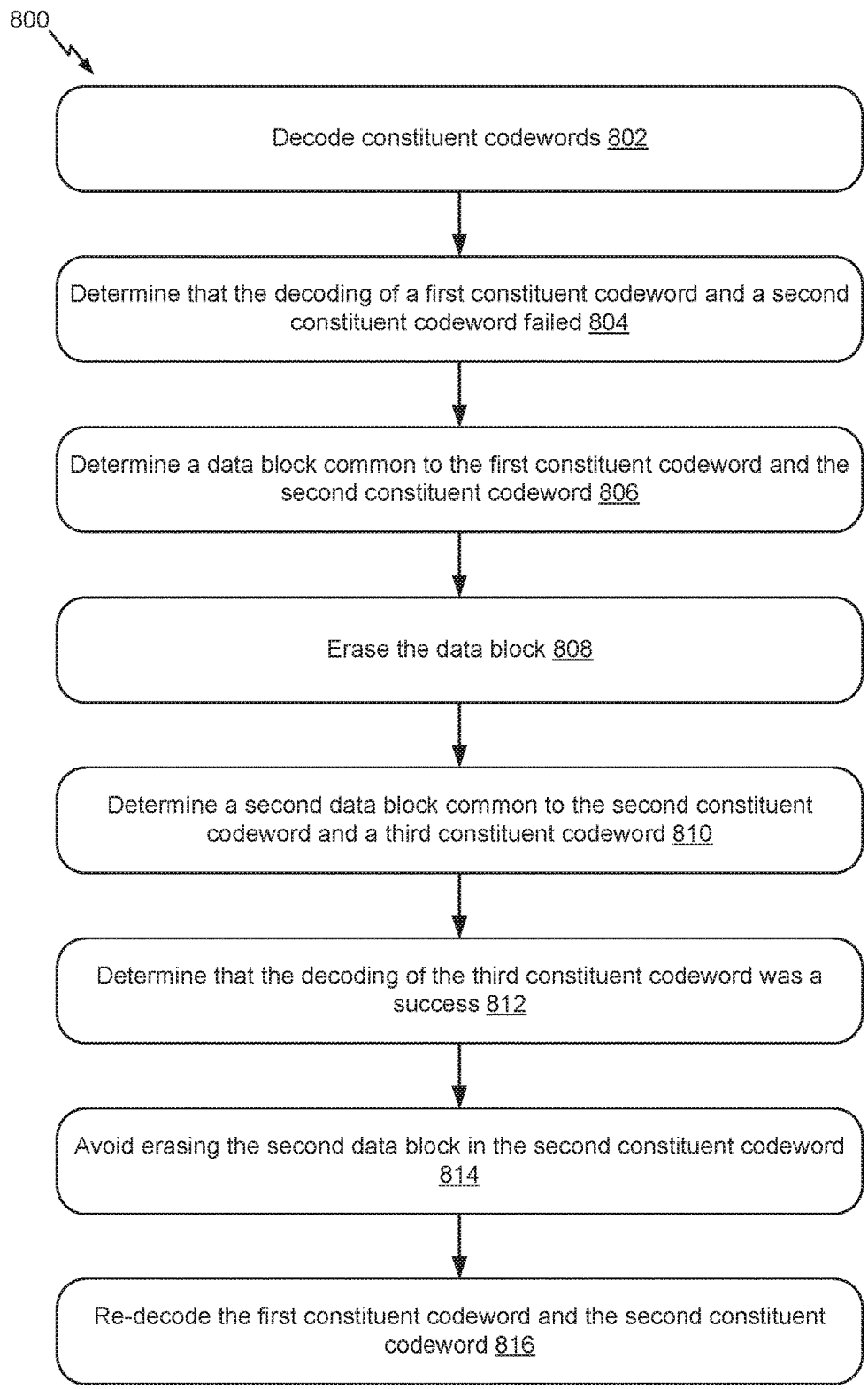
FIG. 8 illustrates an example flow 800 for a GLDPC codeword having multiple constituent codewords with variable lengths and error correction capabilities, in accordance with certain embodiments of the present disclosure.

FIGS. 6-8 illustrate example flows related to the processing of a GLDPC codeword having constituent codewords with variable lengths and error correction capabilities. A system is described as performing particular operations of the example flows. In particular, the system implements an error correcting system that includes a GLDPC encoder and a GLDPC decoder, such as the error correcting system 100 of FIG. 1 and/or that includes some or all of the components 500 of FIG. 5. The system may have a specific hardware configuration to perform the operations of the error correcting system, including those of the GLDPC encoder and GLDPC decoder. Alternatively or additionally, the system may include generic hardware configured with specific instructions. In an example, the system includes one or more processors and one or more memories. The memory(ies) stores computer-readable instructions to embody functionalities specific to the system. The instructions when executed by the processor(s) of the system result in performance of the functionalities by the system. The instructions stored in the memory(ies) in conjunctions with the underlying processor(s) represent means for performing the functionalities. Some of the operations across the example flows are similar. In the interest of brevity, the similarities are not repeated herein. Further, although the operations are illustrated in a particular order, other arrangement of the operations are possible and some of the operations may be skipped as it would be apparent to a person skilled in the art.

FIG. 6 illustrates example flow 600 for encoding and decoding a GLDPC codeword having constituent codewords with variable lengths and error correction capabilities, in accordance with certain embodiments of the present disclosure. As illustrated, the example flow 600 starts at operation 602, where the system accesses data blocks. For example, the data blocks are input to the system. The data blocks are organized in a sequence. Each data block includes one or more information bits.

At operation 604, the system generates constituent codewords for a GLDPC codeword by encoding the data blocks. The constituent codewords have variable lengths and variable error correction capabilities. Each data block is protected in at least two constituent codewords. For instance, a first constituent codeword of the GLDPC codeword encodes at least a data block and has a first length and a first error correction capability. A second constituent codeword of the GLDPC codeword also encodes at least the data block and has a second length and a second error correction capability. The second length is different from the first length and the second error correction capability is different from the first error correction capability. In an example, the GLDPC codeword is constructed by using BCH encoding for the constituent codewords. The construction is subject to a set of rules specifying that each data block should be protected at least twice and specifying how the lengths and error correction capabilities should vary.

At operation 606, the system stores the constituent codewords. For example, the system stores these codewords in memory local to the system or remote at a network location that is accessible to the system.

At operation 608, the system decodes the stored constituent codewords. In an example, the system accesses the stored constituent codewords from the memory in response to a request for the data blocks. The system uses a GLDPC decoding procedure such as a hard decoding procedure (e.g., BCH decoding), a soft decoding procedure (e.g., MAP decoding), or a combination of both hard and soft decoding procedures. The GLDPC decoding procedure also implements erasure decoding where data blocks common to two failed constituent codewords are erased.

At operation 610, the system outputs decoded blocks. For example, upon completion of the GLDPC decoding procedure, the system outputs the decoded bits.

FIG. 7 illustrates an example flow 700 for generating a constituent codeword for a GLDPC codeword having multiple constituent codewords with variable lengths and error correction capabilities, in accordance with certain embodiments of the present disclosure. In the interest of clarity of explanation, the example flow 700 is illustrated in connection with a constituent codeword. Nonetheless, the operations of the example flow 700 can be repeated for all constituent codewords of the GLDPC codeword.

The example flow 700 starts at operation 702, where the system accesses data blocks. At operation 704, the system determines an order of the constituent codeword to be generated in a sequence. The sequence corresponds to the GLDPC codeword. When completely generated, the GLDPC codeword has multiple constituent codewords. The different constituent codewords can be generated in parallel or in series. Nonetheless, the sequence represents an ordered organization of these constituent codewords. In an example, the system identifies the position in the sequence that the to-be-generated constituent codeword should occupy. This position corresponds to the order of the constituent codeword.

At operation 706, the system determines a length "n" and an error correction capability "t" for the constituent codeword based on the order of the constituent codeword in the sequence and based on a rule. In an example, the rule specifies the length and error correction capability based on the order. For instance, the rule specifies that the length starts at an initial length value (e.g. fifteen) for the initial constituent codeword, increases relative to this initial length value for a constituent codeword that falls between the initial constituent codeword and a first intermediary constituent codeword, remains the same between the first intermediary codeword, and a second intermediary codeword, and decreases to a final length value that corresponds to the last constituent codeword in the sequence. The rule also specifies that the error correction capability increases with an increase to the length, remains constant when the length stays the same, and decreases with a decrease to the length. The rule can be stored in the memory of the system or at some remote network location. Of course, other rules are similarly possible. Hence, the system accesses the rule and, based on where the to-be-generated constituent codeword falls in the sequence, sets the length and error correction capability for the constituent codeword.

At operation 708, the system generates the constituent codeword based on the data blocks, the length, and the error correction capability. In an example, BCH coding over a Galois field of order two and size "m" (e.g., $GF(2^m)$) is used to encode a subset of the data blocks. The system computes the size "m" of the Galois field from the length. The system also computes the number of parity blocks "k" from the length "n," the error correction capability "t," and the size "m." The system also computes the number "n−k" of data blocks to be encoded in the constituent codeword from the length "n" and the number of parity blocks "k." The system then selects "n−k" data blocks from the accessed data blocks. The selection is performed such that a selected data block is also selected for encoding in at least one other constituent codeword such that this data block is common to the constituent codeword and the at least one other constituent codeword and, thus, is protected at least twice. The system can maintain information in its memory, where the information identifies each constituent codeword and the data blocks that the constituent codeword encodes. This information can be organized in a list, a table, a map, and/or in a database structure.

FIG. 8 illustrates an example flow 800 for a GLDPC codeword having multiple constituent codewords with variable lengths and error correction capabilities, in accordance with certain embodiments of the present disclosure. This GLDPC codeword corresponds to the GLDPC codeword encoded according to the example flow 700 of FIG. 7. However, due to channel noise, the two GLDPC codewords may not match. The decoding attempts to minimize the number of error bits that represent mismatches between the two GLDPC codewords. In the interest of clarity of explanation, the decoding is illustrated in connection with three constituent codewords. Nonetheless, the operations of the example flow 800 of FIG. 8 can be repeated for all constituent codewords of the GLDPC codeword.

The example flow 800 starts at operation 802, where the system decodes the constituent codewords. For example, the system accesses the GLDPC codeword from a storage location (e.g., from NAND memory) and performs a hard decoding procedure (e.g., BCH decoding), a soft decoding procedure (e.g., MAP decoding), or a combination of hard and soft decoding procedures on each of the constituent codewords At operation 804, the system determines that the decoding of a first constituent codeword and a second constituent codeword failed. In an example, the decoding procedure applied to each constituent codeword identifies whether the decoding was successful or not. The system maintains such indicates in a decoding state. Hence, if each of the first constituent codeword and the second constituent codeword is associated with a "failure" state, the system identifies that their decoding failed.

At operation 806, the system determines a data block that is common to the first constituent codeword and to the second constituent codeword. In an example, the construction of the GLDPC codeword dictates that each data block is protected at least twice. During the construction of the LDPC codeword, the system may have maintained information that identifies each constituent codeword and the data blocks that the constituent codeword encodes. In this example and because each data block is protected at least twice, the system uses the information to identity the data block that block that is common to the first constituent codeword and to the second constituent codeword.

At operation 808, the system erases the data block that is common the first constituent codeword and to the second constituent codeword. The erasure depends on the type of the used decoding procedure. For example, for a soft decoding procedure (e.g., MAP decoding), the erasure sets the LLR of the data block (or the LLRs of the information bits in the data block) to zero in the decoding of each the first constituent codeword and the second constituent codeword.

At operation 810, the system determines a second data block that is common to the second constituent codeword and a third constituent codeword. In an example, the system also use information that identifies each constituent codeword and the data blocks that the constituent codeword encodes to identify the second data block.

At operation 812, the system determines that the decoding of the third constituent codeword was a success. In an example, the system also uses the decoding state to determine the success. For example, if the Hence, if the third constituent codeword has a "success" state, the system identifies that the decoding of the third constituent codeword succeeded.

At operation 814, the system avoids erasing the second data block in the second constituent codeword. In an example, because the second data block is common between the second constituent codeword and the third constituent codeword and because the decoding of the second constituent codeword failed but that of the third constituent codeword succeeded, the system generates a decision not to erase the second data block in the second constituent codeword. For instance, and referring to a soft decoding procedure, the system does not change the LLR of the second data block (or the LLRs of the information bits in the second data block) to zero in the decoding of the second constituent codeword.

At operation 816, the system re-decodes the first constituent codeword and the second constituent codeword based on the performed and avoided erasures. In an example, the system in a next decoding iteration, decodes at least the first constituent codeword and the second constituent codeword given the erased data block.

Figure 9:
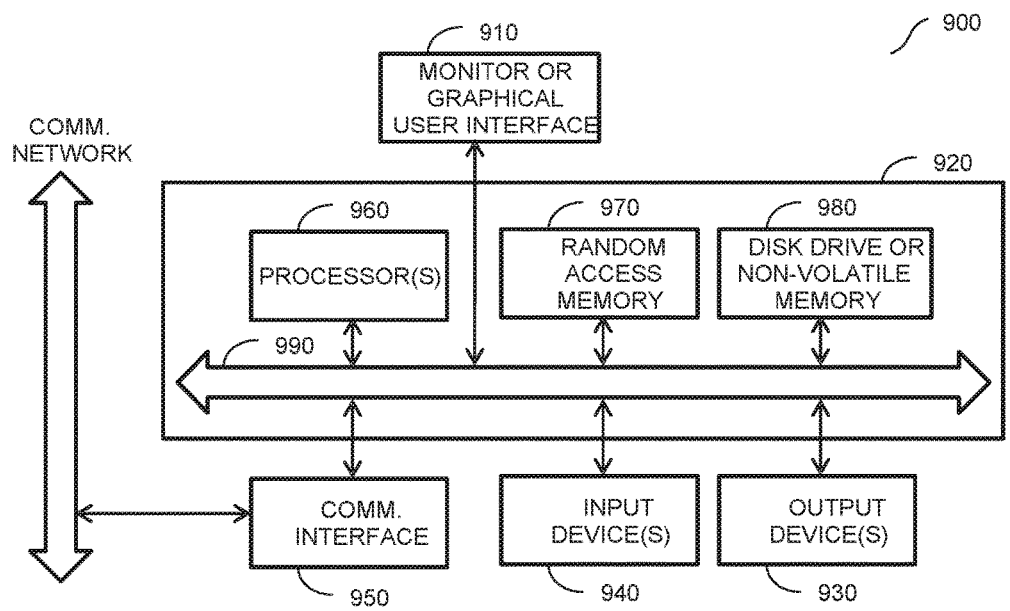
FIG. 9 is representative of a computer system capable of embodying the present disclosure.

FIG. 9 describes one potential implementation of a system, which may be used according to one embodiment, such as the error correction system 100 of FIG. 1. FIG. 9 is merely illustrative of an embodiment of the present disclosure and does not limit the scope of the disclosure as recited in the claims. In one embodiment, the system is a computer system 900 that typically includes a monitor 910, a computer 920, user output devices 930, user input devices 940, communications interface 950, and the like. The error correction system 100 of FIG. 1 implements some or all of the components of the computer system 900.

As shown in FIG. 9, the computer 920 may include a processor(s) 960 that communicates with a number of peripheral devices via a bus subsystem 990. These peripheral devices may include the user output devices 930, the user input devices 940, the communications interface 950, and a storage subsystem, such as random access memory (RAM) 970 and disk drive 980.

The user input devices 940 include all possible types of devices and mechanisms for inputting information to the computer system 920. These may include a keyboard, a keypad, a touch screen incorporated into the display, audio input devices such as voice recognition systems, microphones, and other types of input devices. In various embodiments, the user input devices 940 are typically embodied as a computer mouse, a trackball, a track pad, a joystick, a wireless remote, a drawing tablet, a voice command system, an eye tracking system, and the like. The user input devices 940 typically allow a user to select objects, icons, text and the like that appear on the monitor 910 via a command such as a click of a button or the like.

The user output devices 930 include all possible types of devices and mechanisms for outputting information from the computer 920. These may include a display (e.g., the monitor 910), non-visual displays such as audio output devices, etc.

The communications interface 950 provides an interface to other communication networks and devices. The communications interface 950 may serve as an interface for receiving data from and transmitting data to other systems. Embodiments of the communications interface 950 typically include an Ethernet card, a modem (telephone, satellite, cable, ISDN), (asynchronous) digital subscriber line (DSL) unit, FireWire interface, USB interface, and the like. For example, the communications interface 950 may be coupled to a computer network, to a FireWire bus, or the like. In other embodiments, the communications interfaces 950 may be physically integrated on the motherboard of the computer 920, and may be a software program, such as soft DSL, or the like.

In various embodiments, the computer system 900 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, the computer 920 includes one or more Xeon microprocessors from Intel as the processor(s) 960. Further, one embodiment, the computer 920 includes a UNIX-based operating system.

The RAM 970 and the disk drive 980 are examples of tangible media configured to store data such as embodiments of the present disclosure, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 970 and the disk drive 980 may be configured to store the basic programming and data constructs that provide the functionality of the present disclosure.

Software code modules and instructions that provide the functionality of the present disclosure may be stored in the RAM 970 and the disk drive 980. These software modules may be executed by the processor(s) 960. The RAM 970 and the disk drive 980 may also provide a repository for storing data used in accordance with the present disclosure.

The RAM 970 and the disk drive 980 may include a number of memories including a main random access memory (RAM) for storage of instructions and data during program execution and a read only memory (ROM) in which fixed non-transitory instructions are stored. The RAM 970 and the disk drive 980 may include a file storage subsystem providing persistent (non-volatile) storage for program and data files. The RAM 970 and the disk drive 980 may also include removable storage systems, such as removable flash memory.

The bus subsystem 990 provides a mechanism for letting the various components and subsystems of the computer 920 communicate with each other as intended. Although the bus subsystem 990 is shown schematically as a single bus, alternative embodiments of the bus subsystem may utilize multiple busses.

FIG. 9 is representative of a computer system capable of embodying the present disclosure. It will be readily apparent to one of ordinary skill in the art that many other hardware and software configurations are suitable for use with the present disclosure. For example, the computer may be a desktop, portable, rack-mounted, or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A method, with improved bit error rate and code failure rate, of generating a generalized low-density parity-check code (GLDPC) codeword that comprises constituent codewords, the method comprising:
    accessing, by a GLDPC encoder and from a memory via a memory channel, data blocks, wherein each data block comprises one or more bits;
    generating, by the GLDPC encoder and based on a rule, a first constituent codeword of the GLDPC codeword:
        wherein the first constituent codeword encodes at least a data block from the data blocks and has a first length and a first error correction capability;

wherein the rule specifies a change to an error correction capability of a constituent codeword based on a length of the constituent codeword; and wherein the rule specifies that the data block should be protected in at least two of the constituent codewords;

generating, by the GLDPC encoder and based on the rule, a second constituent codeword of the GLDPC codeword, wherein the second constituent codeword encodes at least the data block and has a second length and a second error correction capability, wherein the second length is different from the first length, and wherein the second error correction capability is different from the first error correction capability;

decoding, by a GLDPC maximum a posteriori probability (MAP) decoder, the constituent codewords; and responsive to identifying a stuck error pattern, resolving the stuck error pattern by configuring an erasure decoder to erase the data block by sending erasure-related information comprising an identifier or a log-likelihood ratio to the GLDPC MAP decoder.

2. The method of claim 1, wherein the second constituent codeword is longer than the first constituent codeword, and wherein the rule specifies that the second error correction capability is greater than the first error correction capability based on the second length being greater than the first length.

3. The method of claim 1, wherein the data blocks are accessed to generate a sequence of the constituent codewords, wherein the rule specifies that the length of the constituent codeword:

increases based on the constituent codeword being between an initial constituent codeword of the sequence and a first intermediary constituent codeword of the sequence, remains constant based on the constituent codeword being between the first intermediary constituent codeword and a second intermediary constituent codeword of the sequence, and decreases based on the constituent codeword being between the second intermediary constituent codeword and a last constituent codeword of the sequence.

4. The method of claim 3, wherein the rule specifies that an error correction capability of the constituent codeword increases with an increase to the length of the constituent codeword, remains constant with the length of the constituent codeword remaining constant, and decreases with a decrease to the length of the constituent codeword.

5. The method of claim 1, wherein the constituent codewords are Bose-Chaudhuri-Hocquenghem (BCH) codewords constructed over a Galois field of order two, wherein the first length and the first error correction capability of the first constituent codeword are smaller than the second length and the second error correction capability of the second constituent codeword, respectively.

6. The method of claim 1, wherein identifying the stuck error pattern further comprises identifying that:

the first constituent codeword failed to decode based on a first number of errors in the first constituent codeword and on the first error correction capability of the first constituent codeword; and the second constituent codeword failed to decode based on a second number of errors in the second constituent codeword and on the second error correction capability of the second constituent codeword.

7. The method of claim 6, wherein resolving the stuck error pattern further comprises:

based on a failure of the decoding of the first constituent codeword and the second constituent codeword, determining that the first constituent codeword and the second constituent codeword have the data block in common;

configuring the erasure decoder to erase the data block based on the data block being common to the first constituent codeword and the second constituent codeword by sending the erasure-related information comprising the identifier or log-likelihood ratio to the GLDPC MAP decoder; and decoding again the first constituent codeword and the second constituent codeword based on the erasing of the data block.

8. The method of claim 7, wherein the decoding further comprises:

determining that a second data block of the second constituent codeword is common with a third constituent codeword;

determining that the decoding of the third constituent codeword was a success; and avoiding an erasure of the second data block in the second constituent codeword based on the success of the decoding of the third constituent codeword.

9. A non-transitory computer storage medium storing instructions that are associated with a system that processes a generalized low-density parity-check (GLDPC) codeword comprising constituent codewords and that, upon execution by a GLDPC encoder of the system, cause the GLDPC encoder to perform operations comprising:

accessing data blocks from a memory via a memory channel, wherein each data block comprises one or more bits;

generating a first constituent codeword of the GLDPC codeword, wherein the first constituent codeword encodes at least a data block from the data blocks and has a first length and a first error correction capability; and generating a second constituent codeword of the GLDPC codeword, wherein the second constituent codeword encodes at least the data block and has a second length and a second error correction capability, wherein the second length is different from the first length, and wherein the second error correction capability is different from the first error correction capability; and wherein the instructions can further be executed by a GLDPC maximum a posteriori probability (MAP) decoder of the system, to perform operations comprising:

decode the first and second constituent codewords;

identify a stuck error pattern by identifying that the first and second constituent codewords failed to decode;

determine that the first and second constituent codewords have the data block in common;

configure an erasure decoder to erase the data block by sending erasure-related information comprising an identifier or a log-likelihood ratio to the GLDPC MAP decoder; and decode again the first and second constituent codewords based on the erasing of the data block.

10. The non-transitory computer storage medium of claim 9, wherein the first constituent codeword and the second constituent codeword are generated based on a rule, wherein the rule specifies a change to an error correction capability of a constituent codeword based on a length of the constituent codeword.

11. The non-transitory computer storage medium of claim 10, wherein the second constituent codeword is longer than the first constituent codeword, and wherein the rule specifies that the second error correction capability is greater than the first error correction capability based on the second length being greater than the first length.

12. The non-transitory computer storage medium of claim 10, wherein the data blocks are accessed to generate a sequence of the constituent codewords, wherein the rule specifies that the length of the constituent codeword:
   increases based on the constituent codeword being between an initial constituent codeword of the sequence and a first intermediary constituent codeword of the sequence,
   remains constant based on the constituent codeword being between the first intermediary constituent codeword and a second intermediary constituent codeword of the sequence, and
   decreases based on the constituent codeword being between the second intermediary constituent codeword and a last constituent codeword of the sequence.

13. The non-transitory computer storage medium of claim 12, wherein the rule specifies that an error correction capability of the constituent codeword increases with an increase to the length of the constituent codeword, remains constant with the length of the constituent codeword remaining constant, and decreases with a decrease to the length of the constituent codeword.

14. The non-transitory computer storage medium of claim 9, wherein the constituent codewords are Bose-Chaudhuri-Hocquenghem (BCH) codewords constructed over a Galois field of order two, wherein the first length and the first error correction capability of the first constituent codeword are smaller than the second length and the second error correction capability of the second constituent codeword, respectively.

15. A system, comprising:
   a memory accessible via a memory channel;
   a generalized low-density parity-check (GLDPC) encoder configured to process a GLDPC codeword comprising constituent codewords, the GLDPC encoder operable to:
      access data blocks from the memory via the memory channel, wherein each data block comprises one or more bits;
      generate a first constituent codeword of the GLDPC codeword, wherein the first constituent codeword encodes at least a data block from the data blocks and has a first length and a first error correction capability; and
      generate a second constituent codeword of the GLDPC codeword, wherein the second constituent codeword encodes at least the data block and has a second length and a second error correction capability, wherein the second length is different from the first length, and wherein the second error correction capability is different from the first error correction capability; and
   a GLDPC maximum a posteriori probability (MAP) decoder operable to:
      decode the first and second constituent codewords;
      identify a stuck error pattern by identifying that the first and second constituent codewords failed to decode;
      determine that the first and second constituent codewords have the data block in common;
      configure an erasure decoder to erase the data block by sending erasure-related information comprising an identifier or a log-likelihood ratio to the GLDPC MAP decoder; and
      decode again the first and second constituent codewords based on the erasing of the data block.

16. The system of claim 15, wherein the first constituent codeword and the second constituent codeword are generated based on a rule, wherein the rule specifies a change to an error correction capability of a constituent codeword based on a length of the constituent codeword.

17. The system of claim 15, wherein the GLDPC encoder is further operable to decode the constituent codewords, wherein the decoding identifies that:
   the first constituent codeword failed to decode based on a first number of errors in the first constituent codeword and on the first error correction capability of the first constituent codeword; and
   the second constituent codeword failed to decode based on a second number of errors in the second constituent codeword and on the second error correction capability of the second constituent codeword.

18. The system of claim 17, wherein the decoding further comprises:
   based on a failure of the decoding of the first constituent codeword and the second constituent codeword, determining that the first constituent codeword and the second constituent codeword have the data block in common;
   erasing the data block based on the data block being common to the first constituent codeword and the second constituent codeword; and
   decoding again the first constituent codeword and the second constituent codeword based on an erasure of the data block.

19. The system of claim 18, wherein the decoding further comprises:
   determining that a second data block of the second constituent codeword is common with a third constituent codeword;
   determining that the decoding of the third constituent codeword was a success; and
   avoiding an erasure of the second data block in the second constituent codeword based on the success of the decoding of the third constituent codeword.

20. The method of claim 1, further comprising repeating, one or more times, a procedure comprising:
   re-generating, by the GLDPC encoder, the first and second constituent codewords of the GLDPC codeword;
   decoding, by the GLDPC MAP decoder, the constituent codewords; and
   responsive to identifying an additional stuck error pattern, resolving the additional stuck error pattern by configuring the erasure decoder to erase the data block by sending erasure-related information comprising an identifier or a log-likelihood ratio to the GLDPC MAP decoder.

* * * * *